United States Patent
Pfutzner et al.

(10) Patent No.: US 9,443,723 B2
(45) Date of Patent: Sep. 13, 2016

(54) INTEGRATED CIRCUITS WITH AN INSULTATING LAYER AND METHODS FOR PRODUCING SUCH INTEGRATED CIRCUITS

(71) Applicant: GLOBALFOUNDRIES, Inc., Grand Cayman (KY)

(72) Inventors: Ronny Pfutzner, Dresden (DE); Andreia Ioana Popa, Dresden (DE); Christof Streck, Coswig (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 66 days.

(21) Appl. No.: 14/325,500

(22) Filed: Jul. 8, 2014

(65) Prior Publication Data

US 2016/0013050 A1    Jan. 14, 2016

(51) Int. Cl.
| | |
|---|---|
| *H01L 21/44* | (2006.01) |
| *H01L 21/02* | (2006.01) |
| *H01L 21/768* | (2006.01) |
| *H01L 23/528* | (2006.01) |
| *H01L 23/522* | (2006.01) |
| *H01L 23/532* | (2006.01) |

(52) U.S. Cl.
CPC ... *H01L 21/02318* (2013.01); *H01L 21/02164* (2013.01); *H01L 21/02203* (2013.01); *H01L 21/76802* (2013.01); *H01L 21/76877* (2013.01); *H01L 23/528* (2013.01); *H01L 23/5226* (2013.01); *H01L 23/53295* (2013.01)

(58) Field of Classification Search
CPC ......... H01L 21/02203; H01L 23/53295; H01L 21/76877; H01L 23/5226; H01L 21/76802; H01L 23/528; H01L 21/02318; H01L 21/02164
USPC ................... 438/623, 666, 778, 622
See application file for complete search history.

(56) References Cited

U.S. PATENT DOCUMENTS

| | | |
|---|---|---|
| 6,583,048 B1 | 6/2003 | Vincent et al. |
| 6,846,515 B2 | 1/2005 | Vrtis et al. |
| 2004/0175501 A1* | 9/2004 | Lukas ............ C23C 16/401 427/255.28 |
| 2010/0151206 A1* | 6/2010 | Wu ............... C23C 16/401 428/158 |
| 2011/0006406 A1* | 1/2011 | Urbanowicz ...... C23C 16/401 257/632 |

* cited by examiner

Primary Examiner — Thien F Tran
(74) Attorney, Agent, or Firm — Lorenz & Kopf, LLP

(57) ABSTRACT

Integrated circuits and methods for producing the same are provided. A method of producing the integrated circuits includes forming an insulating layer overlying a substrate. The insulating layer includes a first composition that includes silicon oxide and a porogen. The porogen is removed from the first composition to form a second composition that includes a pore, where the second composition has a dielectric constant lower than that of the first composition. An insulating layer mechanical property desired range is determined, where the second composition has an insulating material mechanical property outside of the insulating layer mechanical property desired range. The second composition is altered to form a third composition, where the third composition has the insulating layer mechanical property within the insulating layer mechanical property desired range.

17 Claims, 8 Drawing Sheets

INTEGRATED CIRCUITS WITH AN INSULATING LAYER AND METHODS FOR PRODUCING SUCH INTEGRATED CIRCUITS

TECHNICAL FIELD

The technical field generally relates to integrated circuits and methods for producing integrated circuits, and more particularly relates to integrated circuits with an insulating layer having a mechanical property set to within a desired range, and methods for producing such integrated circuits.

BACKGROUND

The size of integrated circuits is decreasing, and the decreasing size results in smaller lines and components within the integrated circuit. Insulating layers separate the various lines and components, and the lines and components are placed closer and closer together as the space requirements continue to shrink. The closer spacing of lines and electrical components requires the insulating layers to have a lower dielectric constant to properly insulate one line or component from the next. Low dielectric constant insulating materials are desired to facilitate the production of smaller and denser integrated circuits.

Silicon dioxide ($SiO_2$ or "oxide") has been used as an insulating material in many integrated circuits. Silicon oxide can be produced from silane ($SiH_4$) or tetraethylorthosilicate (TEOS) and $O_2$, and such conventional oxide has a dielectric constant k that is generally greater than about 3.9. One technique used to lower the dielectric constant of oxide is to dope it with organic groups to produce organosilicate glass (OSG) with dielectric constants that can range from about 2.7 to about 3.5. OSG may be deposited as a film with a density of about 1.5 grams per cubic centimeter ($g/cm^3$). Porosity has been added to OSG to produce porous OSG insulating materials with a dielectric constant below about 2.7, where the void space in the pores has a dielectric constant of about 1.0. Porous OSG can be created by adding pore-forming compounds (called "porogens") to the reagents during the deposition process, and then removing the porogen after the insulating layer is deposited. However, forming the pores in the OSG material also alters many mechanical properties of the OSG, such as mechanical hardness, elastic modulus, residual stress, thermal stability, and adhesion to a variety of substrates. Unfortunately, many of the mechanical properties of the porous OSG material are not as desirable for the production of integrated circuits as OSG material without the pores.

Often, a trade-off between the reduction in the dielectric constant and the undesirable mechanical properties for porous OSG materials must be realized, and the best material for one application may not be the best material for another application. Design requirements for insulating layers vary from one type of integrated circuit to the next. Man power is required to design different processes and process conditions to produce the insulating layers with different mechanical properties and dielectric constants, and there may be equipment changes and/or material changes for different types of integrated circuits. The man power, equipment changes, and material changes all increase the cost of production for integrated circuits.

Accordingly, it is desirable to provide integrated circuits with an insulating material having a desirable dielectric constant that is deposited in a standard manner, and then altered to produce an insulating material with mechanical properties within a desired range. It is also desirable to provide methods for producing such integrated circuits. In addition, it is desirable to provide integrated circuits and methods with an insulating material having adjustable mechanical properties, where adjustment of the mechanical properties is incorporated into the integrated circuit manufacturing process. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for producing the same are provided. In an exemplary embodiment, a method for producing an integrated circuit includes forming an insulating layer overlying a substrate. The insulating layer includes a first composition that includes silicon oxide and a porogen. The porogen is removed from the first composition to form a second composition that includes a pore, where the second composition has a dielectric constant lower than that of the first composition. An insulating layer mechanical property desired range is determined, where the second composition has a mechanical property outside of the insulating layer mechanical property desired range. The second composition is altered to form a third composition, where the third composition has the mechanical property within the insulating layer mechanical property desired range.

A method for producing an integrated circuit is provided in another embodiment. An insulating layer is formed overlying a substrate, where the insulating layer includes a first composition with silicon oxide and a porogen. The porogen is removed from the first composition to form a second composition with a pore, where the pore has a pore surface. The second composition is restructured to form a third composition, where the restructuring breaks a silicon/carbon bond on the pore surface and forms a silicon/oxygen bond on the pore surface. The third composition has a hardness that is harder than the hardness of the second composition.

In yet another embodiment, an integrated circuit is provided. The integrated circuit includes a substrate and an electronic component overlying the substrate. A contact is electrically connected to the electronic component. An insulating layer overlies the substrate and is adjacent to the contact, where the insulating layer includes silicon oxide and a plurality of pores having a pore surface. About 90 percent of the pore surface is silicon oxide.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

An insulating layer is formed overlying a substrate, and the insulating layer may overly an electronic component. The insulating layer is formed with a first composition, where the first composition is an organic silicon oxide that includes a porogen. The porogen may be an organic compound that can be vaporized or otherwise removed from the insulating layer. The porogen is removed from the first composition causing the first composition to form a second composition, where the second composition is a porous organosilicate glass material. The space previously occupied by the porogen forms the pores, and there are some methyl groups or other organic groups within a silicon oxide matrix of the second composition. The second composition is then altered to adjust a mechanical property thereof and thus form a third composition having a mechanical property within a desired insulating layer mechanical property range. The second composition may be altered by exposure to an oxidizing agent that converts silicon/carbon bonds, such as from methyl groups in the insulating material, into silicon/oxygen bonds and thus restructures the insulating layer. The mechanical properties of the insulating layer change as the silicon/carbon bonds are converted into silicon/oxygen bonds. For example, the hardness and the elastic modulus may both increase as more silicon/oxygen bonds are formed, but the dielectric constant may also increase. Different process conditions and timing can be used to adjust the extent that the silicon/carbon bonds are converted to silicon/oxygen bonds, so the mechanical properties can be "tuned" to within a desired range, herein called "an insulating layer mechanical property desired range" or "a mechanical property desired range." This allows the manufacturer to use a single process to form the insulating layer, and then the mechanical properties of the insulating layer can be selected and adjusted to meet requirements for different services or purposes.

Figure 1:
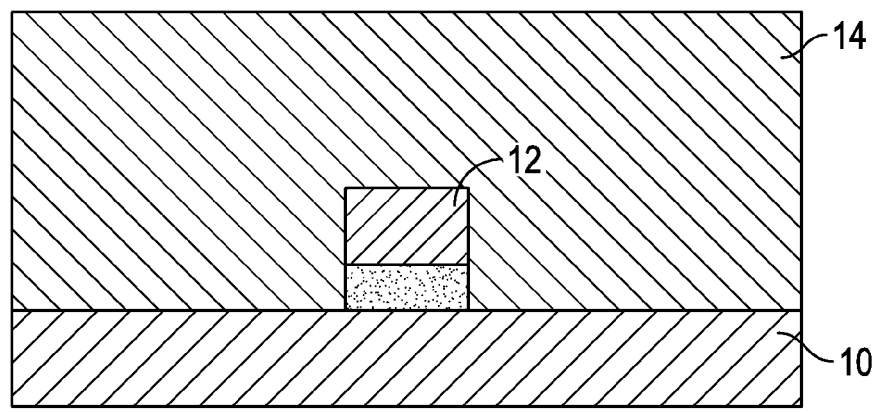
FIGS. 1-4, 6, 8, and 10 illustrate, in cross sectional views, a portion of an integrated circuit and methods for its fabrication in accordance with exemplary embodiments.

Reference is made to the exemplary embodiment in FIG. 1. An integrated circuit 8 includes an electronic compound 12 formed overlying a substrate 10. As used herein, the term "substrate" 10 will be used to encompass substrates formed from semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate. The substrate 10 may be a bulk silicon wafer (as illustrated) or may be a thin layer of silicon on an insulating layer (commonly known as silicon-on-insulator or SOI) that, in turn, is supported by a carrier wafer.

The electronic component 12 can be a wide variety of electronic components, including but not limited to a transistor, a resistor, a capacitor, or other electronic components. In an exemplary embodiment, the electronic component 12 is a planar transistor, as illustrated, but finned transistors, other types of transistors, or other types of electronic components can also be used. The electronic component 12 is produced by processes and techniques well known to those skilled in the art, and the method of production and the type of electronic component is not critical to this description.

A plug layer 14 may be formed overlying the electronic component 12 and the substrate 10, wherein the plug layer 14 includes an electrically insulating material. The plug layer 14 may be a wide variety of electrically insulating materials, including but not limited to silicon oxide, silicon nitride, OSG, etc. In an exemplary embodiment, the plug layer 14 is silicon oxide that may be formed by chemical vapor deposition using silane and oxygen, or dichlorosilane and nitrous oxide, or tetraethylorthosilicate.

Figure 2:
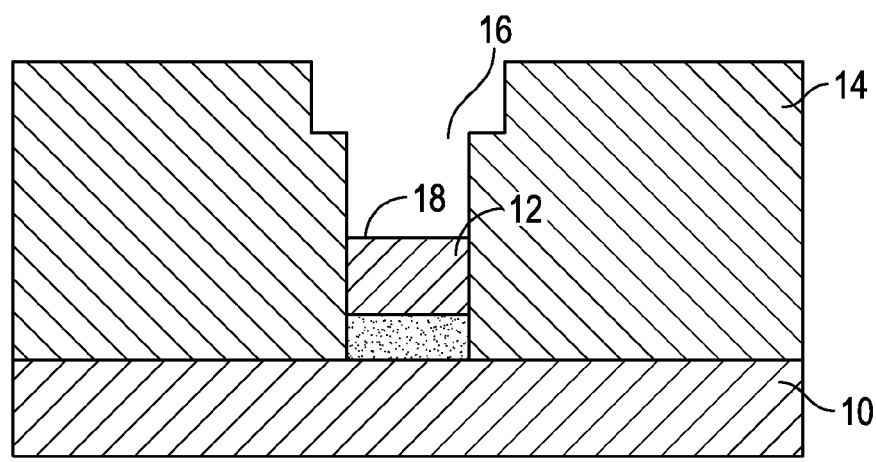

A plug via 16 may be formed through the plug layer 14, as illustrated in the exemplary embodiment in FIG. 2. The plug via 16 may be formed by etching, such as with carbon tetrafluoride and hydrogen, where an etch mask (not illustrated) may be used, as is well known in the art. The plug via 16 may penetrated the plug layer 14 and extend to a contact point 18 on the electronic component 12. The contact point 18 may be a source, drain, or gate for a transistor, or another part of an electronic component 12 where an electrical connection is desired.

Figure 3:
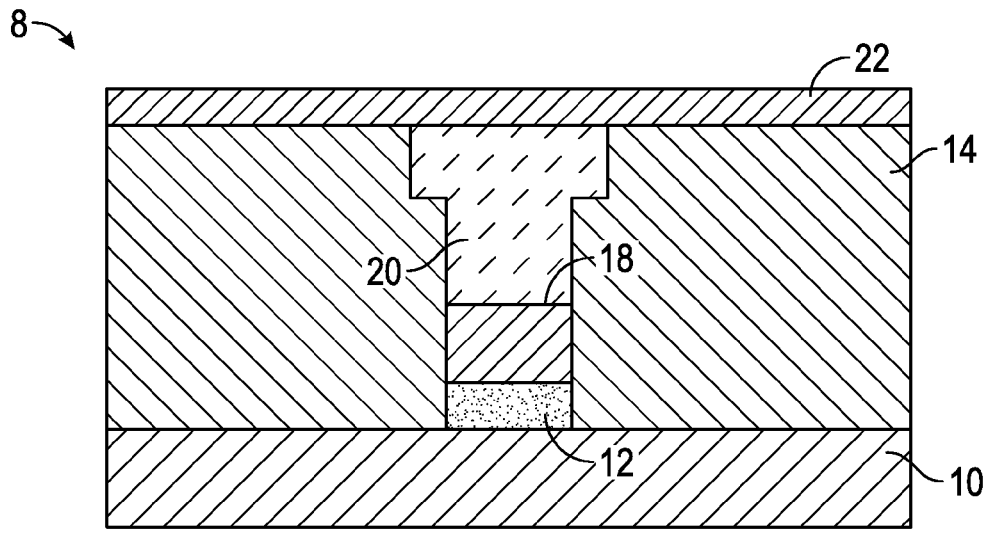

A cover 20 may be formed in the plug via 16, as illustrated in the exemplary embodiment in FIG. 3. The cover 20 may include an electrically conductive material and form an electrical connection with the electronic component at the contact point 18. In an exemplary embodiment, the cover 20 may include copper, and may be formed by the damascene process, but the cover 20 may be other conductive materials in other embodiments. The method of forming the cover 20 is not critical to this invention. A blok layer 22 may then be formed overlying the cover 20 and the plug layer 14. The blok layer 22 is an insulating material, such as silicon nitride that can be deposited by low pressure chemical vapor deposition using ammonia and dichlorosilane. The blok layer 22 may serve as an etch stop in future process steps, may serve to limit oxygen migration, and may aid in adhesion for the plug layer 14 and additional materials or layers formed overlying the blok layer 22.

Figure 4:
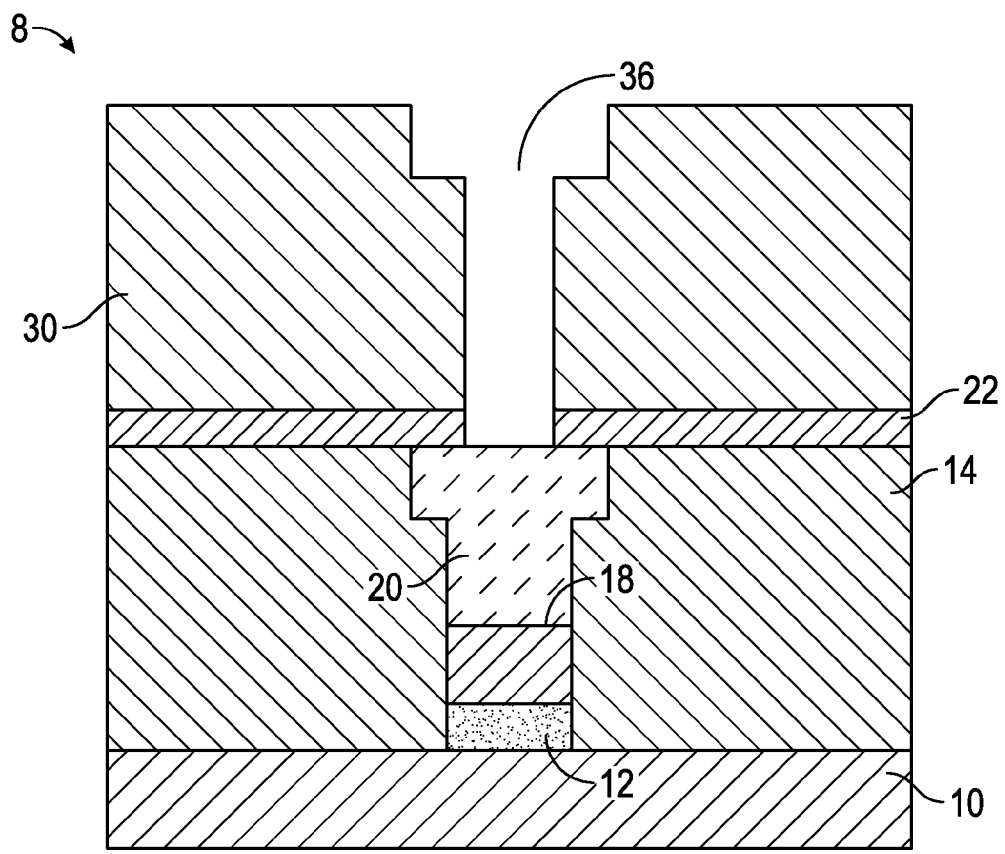
Figure 5:
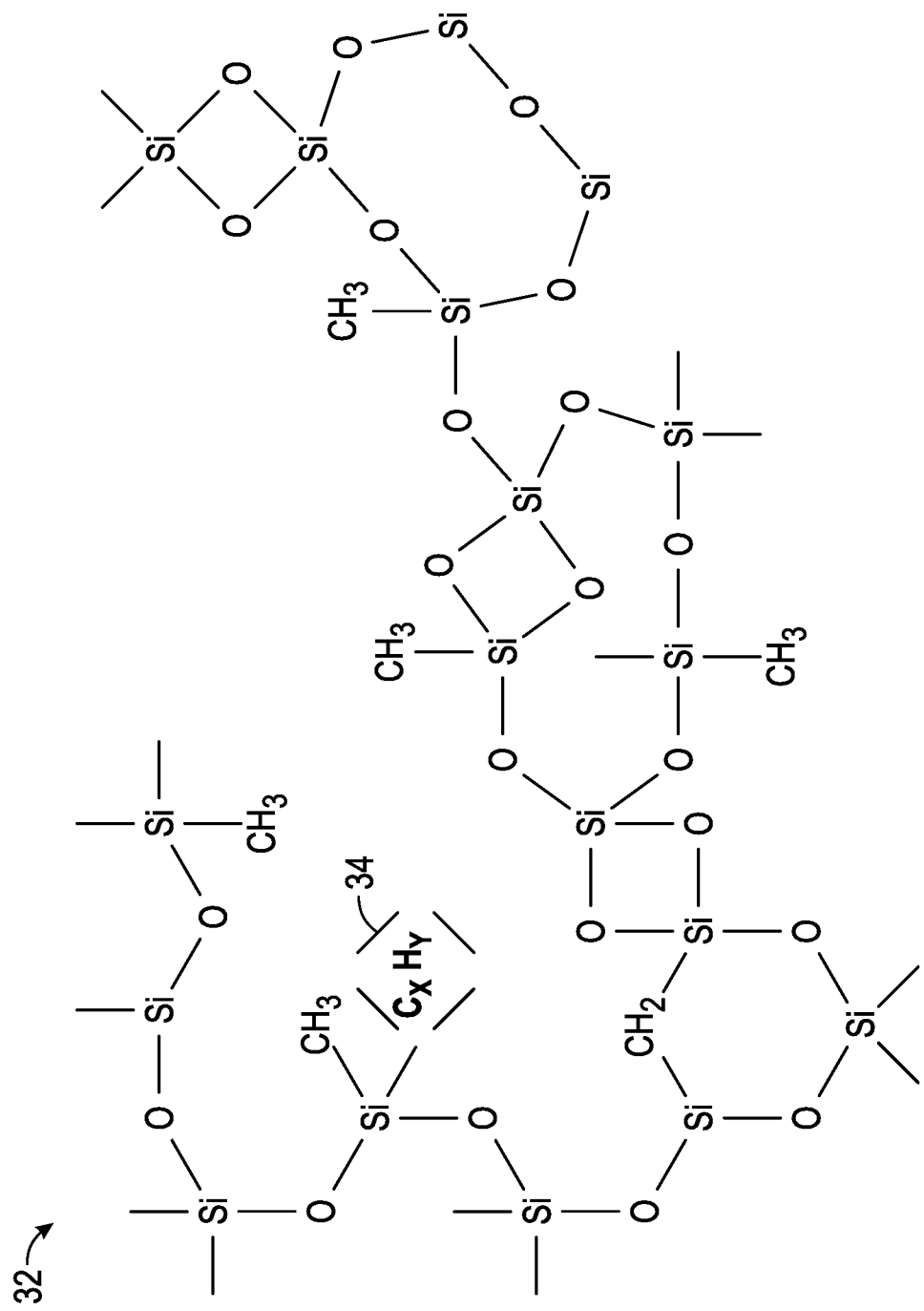
FIGS. 5, 7, and 9 illustrate representations of compositions of the integrated circuit.

Referring to FIG. 4, an insulating layer 30 is formed overlying the blok layer 22. The insulating layer 30 is initially formed from a first composition 32, where the first composition 32 may be an organosilicate glass (OSG) with a porogen 34 within the first composition 32, as illustrated in FIG. 5 with continuing reference to FIG. 4. The first composition 32 has a dielectric constant that may be about 2.7 to about 3.5 in various embodiments. The first composition 32 may be formed by chemical vapor deposition using a mixture of reagents that include silicon-containing precursors and porogen precursors. The silicon-containing precursor includes at least one silicon (Si) atoms, such as an organosilane or an organosiloxane with one or more silicon/carbon bonds. Examples of silicon-containing precursors include, but are not limited to, tetramethylcyclotetrasiloxane (TMCTS), diethoxymethylsilane (DEMS), dimethyldimethoxysilane (DMDMOS), trimethylsilane (3MS), TEOS, triethoxysilane, di-tert-butoxysilane, and di-tert-butoxydiacetoxysilane, but many other silicon-containing precursors may be used in alternate embodiments. Precursors without silicon/carbon bonds may be used in conjunction with the precursors that include silicon/carbon bonds in some embodiments, such as silane or disilane. The porogen precursor is a reagent that can generate a void within the insulating layer 30, such as one or more alkyl hydrocarbons that may include one or more atom of oxygen, nitrogen, fluorine, boron, or phosphorous. In an exemplary embodiment, the porogen 34 is neopentane, neohexane, isopentane, isohexane, cyclohexanone, or a wide variety of other compounds. In an exemplary embodiment, the silicon-containing precursor and the porogen precursor are part of the same molecule. For example, it is possible to use neohexyl tetramethylcyclotetrasiloxane (Neohexyl TMCTS) as a single species, where the TMCTS portion of the molecule forms the base OSG structure and the bulky alkyl substituent neohexyl is the pore forming porogen 34.

The silicon-containing precursor and the porogen precursor may be deposited by plasma enhanced chemical vapor deposition onto the substrate 10. The insulating layer 30 may be formed to minimize the dielectric constant of the porous OSG, described below, such that the concentration of porogens 34 in the first composition 32 is high. In an exemplary embodiment, silicon-containing precursor and the porogen precursor are supplied to deposit the insulating layer 30 where the mass percent carbon in the first composition 32 is about 20% or greater than in an OSG material formed from the same silicon-containing precursor without any of the porogen precursor. In some embodiments, the porogen 34 may not be chemically bound to the OSG material, which may facilitate removal of the porogen 34 as described below. However, in other embodiments the porogen 34 may be chemically bound to the OSG material.

Figure 6:
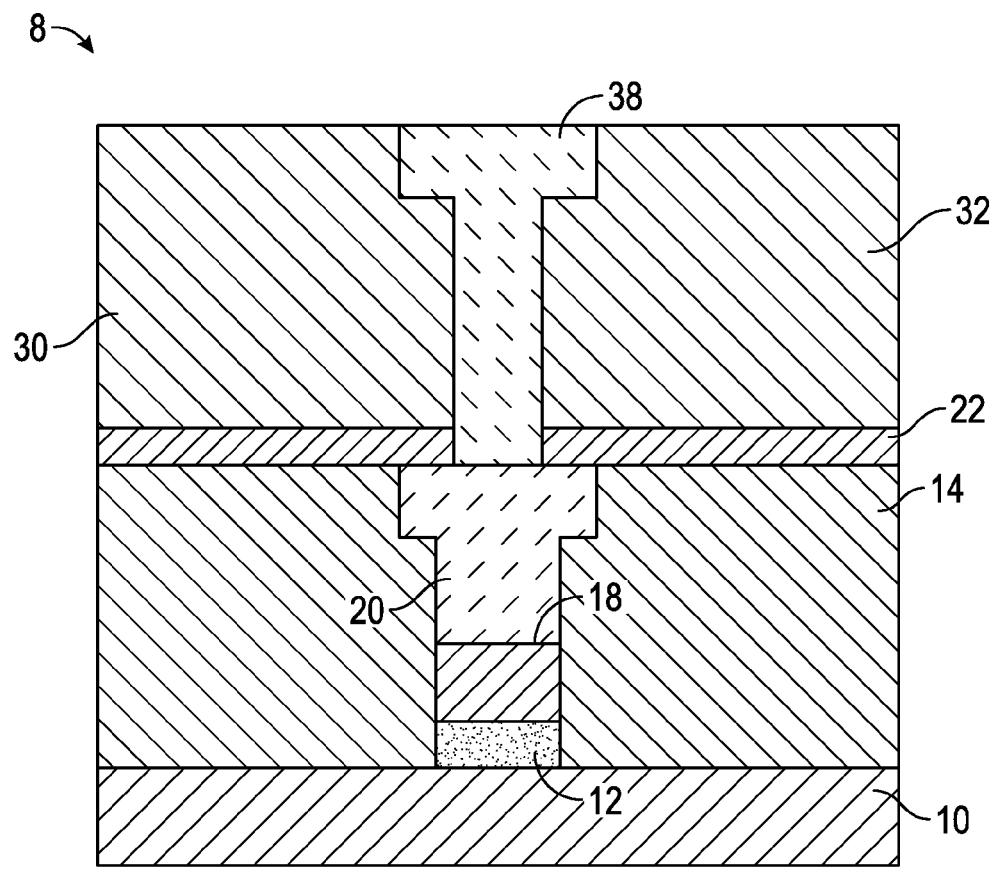

In an exemplary embodiment, a via 36 is formed in the insulating layer 30, where the via 36 may be aligned with the cover 20. The via 36 is etched with an etchant selective to the material of the insulating layer 30, and an etch mask (not illustrated) may be used to position the via 36, as is well known in the art. The via 36 may be etched through the blok layer 22 in some embodiments, such that the cover 20 forms the bottom of the via 36, or the cover 20 forms a portion of the bottom of the via 36. A contact 38 may be formed in the via 36, as illustrated in FIG. 6 with continuing reference to FIGS. 4 and 5, where the contact 38 is electrically connected to the cover 20. The cover 20 is electrically connected to the electronic component 12, as described above, so the contact 38 is electrically connected to the electronic component 12 through the cover 20. In an exemplary embodiment, the contact 38 includes copper, and may be formed by the damascene process, as understood by those skilled in the art. In other embodiments, the contact 38 may be formed from conductive materials other than copper.

Figure 7:
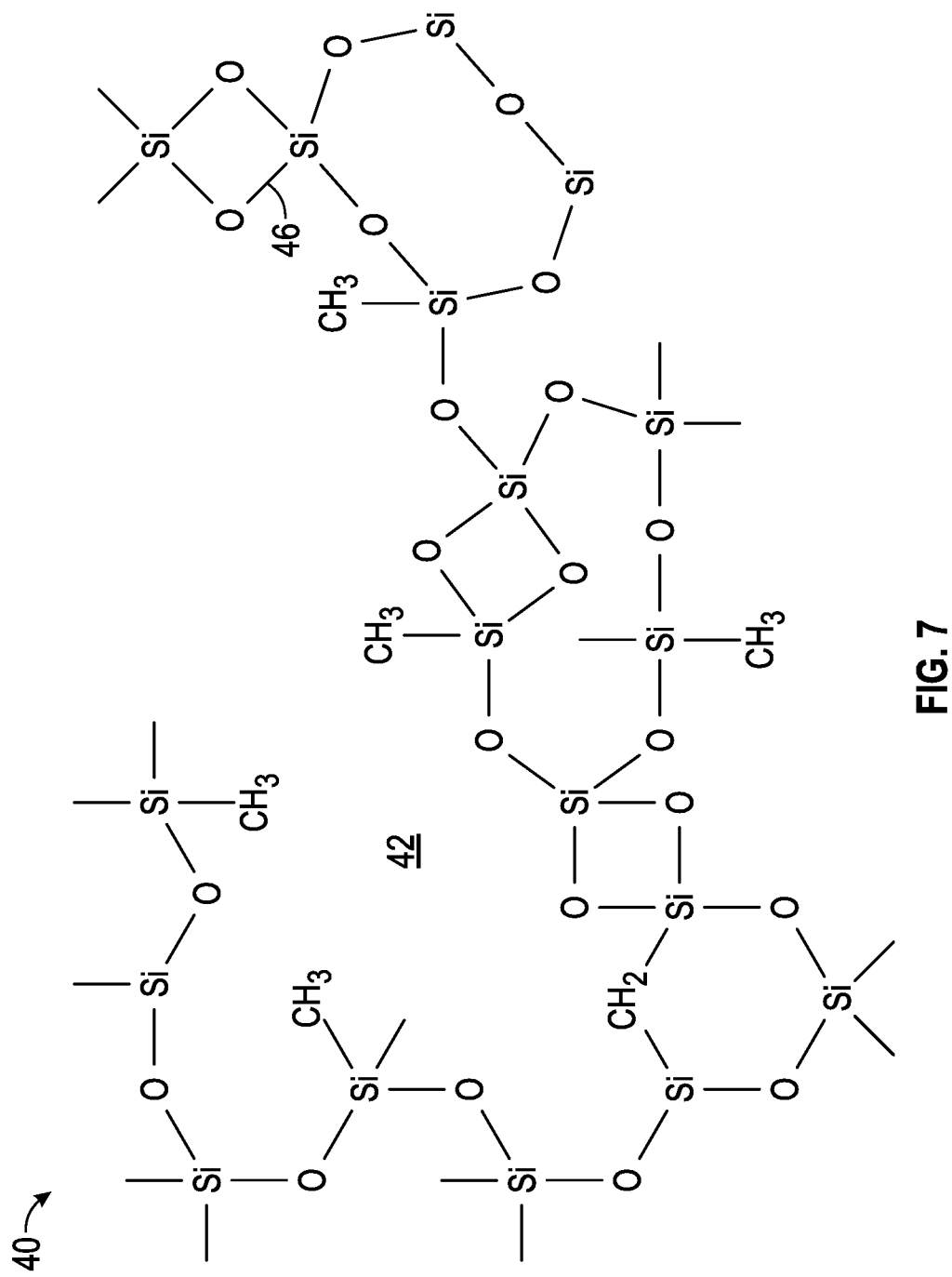
Figure 8:
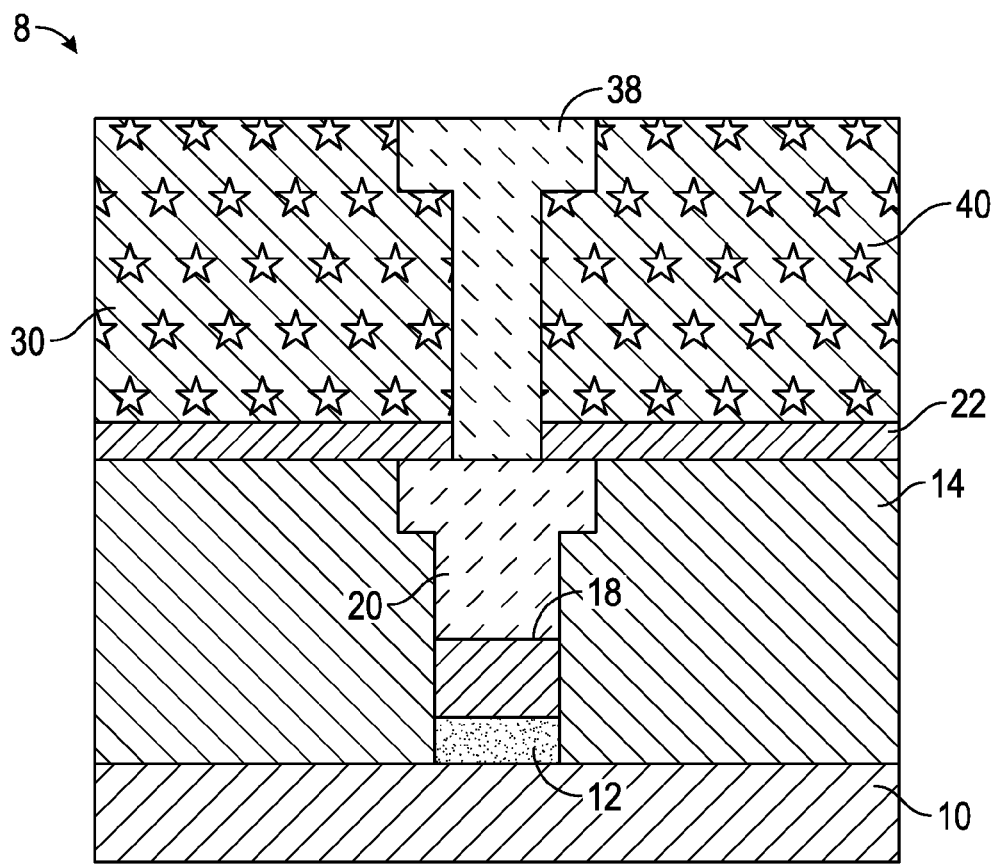

The porogen 34 is removed from the first composition 32 to form a second composition 40, as illustrated in FIGS. 7 and 8, with continuing reference to FIGS. 4-6. The porogen 34 may be removed before or after the via 36 and contact 38 are formed in various embodiments, so the via 36 may be formed in the insulating layer 30 after the first composition 32 has been changed into the second composition 40 in some embodiments. The porogen 34 may be removed from the first composition 32 by a porogen removal step, such that the second composition 40 includes a plurality of pores 42. Not to be bound by theory, but the pores 42 may be about the same size and shape as the porogens 34 of the first composition 32. The pores 42 of the second composition 40 may form a pore volume of about 50% to about 80% of the second composition 40 in some embodiments, or about 70% to about 80% of the second composition 40 in other embodiments. The dielectric constant generally decreases as the pore volume increases, but many mechanical properties may be undesirable with a high pore volume, such as hardness or elastic modulus.

In an exemplary embodiment, the porogen removal process includes exposing the insulating layer 30 to electromagnetic radiation having a frequency in the ultraviolet light (UV) or visible light range. However, several different porogen removal processes can be used in alternate embodiments, such as thermal annealing, exposure to oxidizing or reducing chemical agents, exposure to electron beam radiation, exposure to plasmas, exposure to microwave radiation, exposure to radiation from a laser, and combinations thereof.

Not to be bound by theory, but the porogen 34 may be vaporized and removed from the insulating layer 30 in some embodiments, but in other embodiments the porogen 34 may be reacted to form a gas or other fluid that can escape from the pores 42, or the porogen 34 may be broken down into smaller compounds that can then escape from the insulating layer 30. The second composition 40 of the insulating layer 30 has a dielectric constant that is lower than that of the first composition 32 because of the high pore volume, where the dielectric constant of the second composition 40 may be about 2.0 to about 2.2 in some embodiments, or about 2.0 to about 2.5 in other embodiments. However, the mechanical properties of the second composition 40 may be relatively weak, such as a Vickers hardness of about 1.0 to 1.5 gigapascals (GPa) in some embodiments, or about 1.3 GPa or less in other embodiments, and an elastic modulus of about 6 to about 8 GPa. The Vickers hardness and elastic modulus of the second composition 40 may be lower than that of the first composition 32.

One or more insulating layer mechanical property desired ranges are determined for the insulating layer 30, and the second composition 40 may have one or more mechanical properties outside of the insulating layer mechanical property desired range(s). In an exemplary embodiment, a customer provides the desired range for one or more specified mechanical properties, where the mechanical properties are set for a desired use for the integrated circuit 8. For example, a higher Vickers hardness value or elastic modulus may be specified for an integrated circuit 8 that will be used in equipment designed for larger impacts. There may be a trade-off, where the higher hardness or other mechanical properties results in the insulating layer 30 having a higher dielectric constant, so the insulating layer mechanical property desired range may have to account for a trade-off in more desirable mechanical properties and a less desirable dielectric constant.

Figure 9:
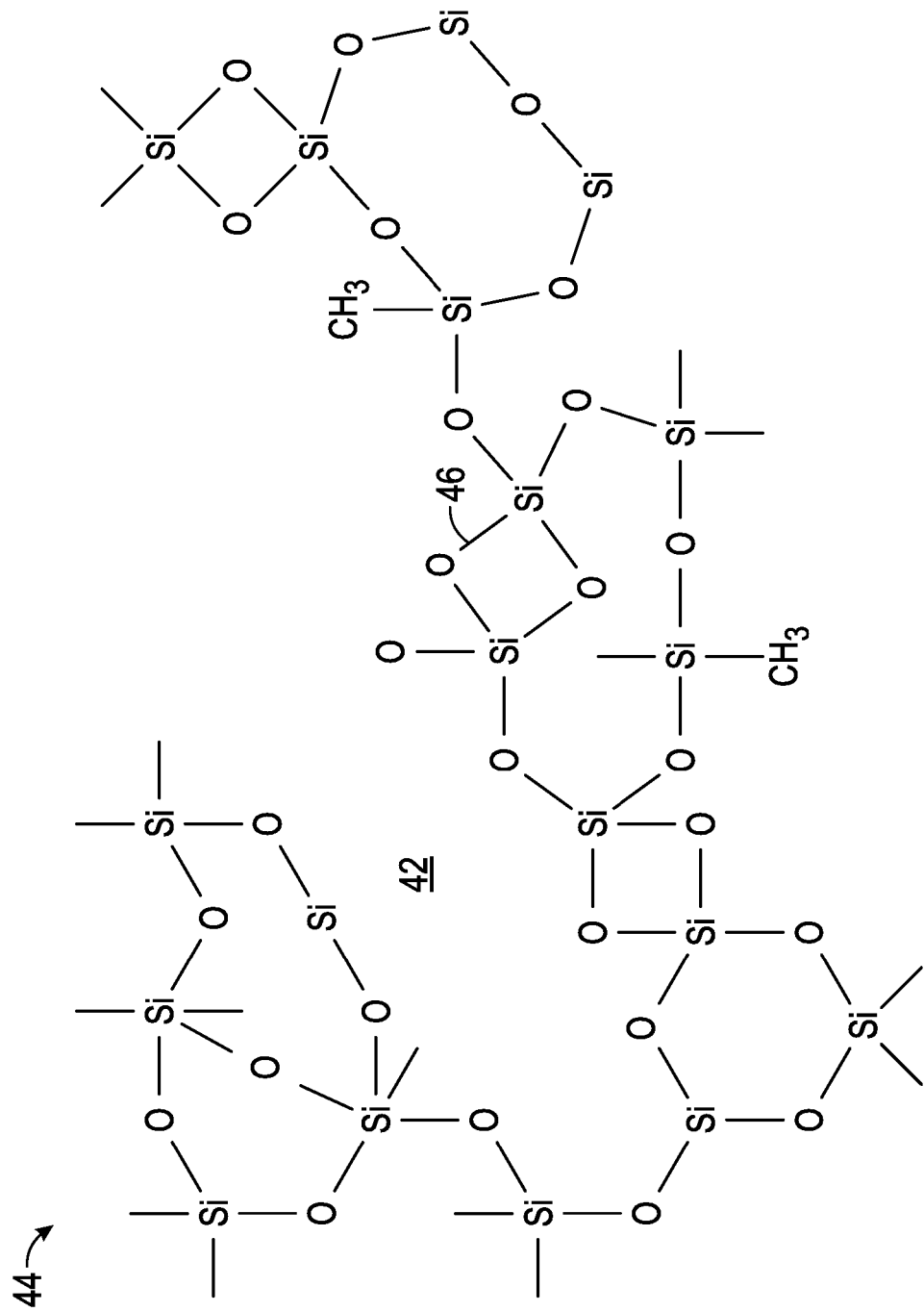
Figure 10:
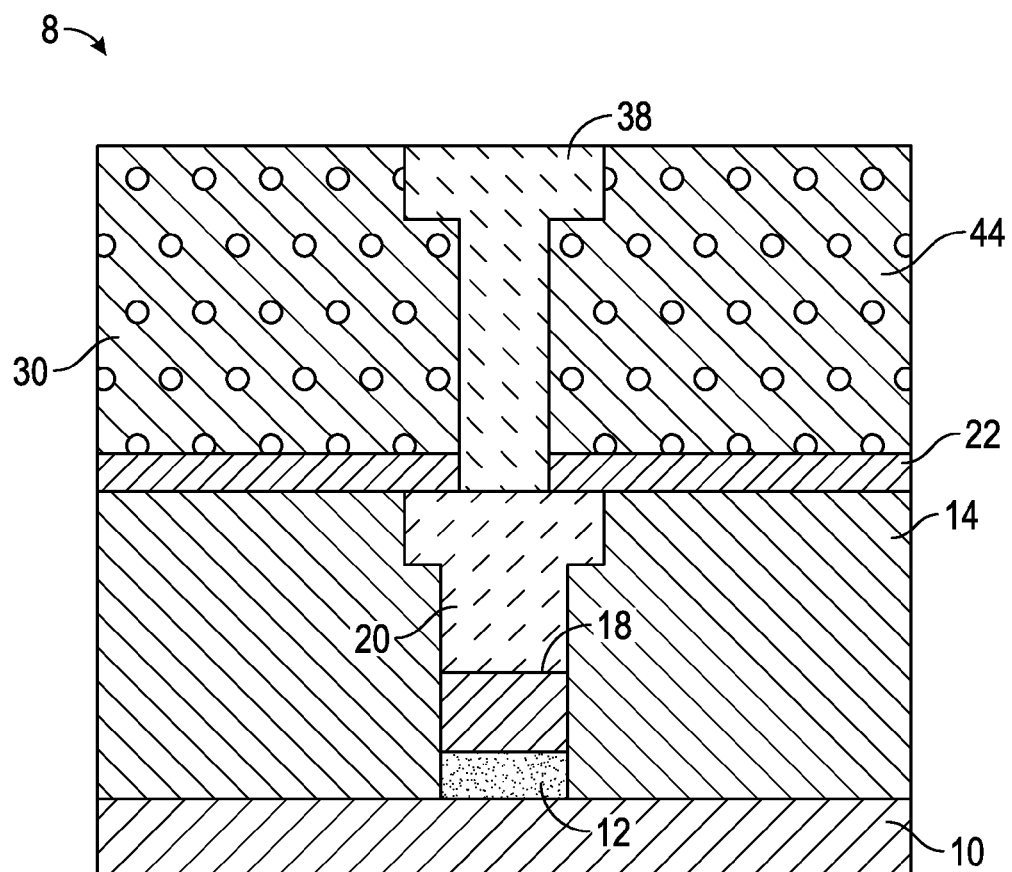

The second composition 40 is altered to form a third composition 44, as illustrated in FIGS. 9 and 10 with continuing reference to FIGS. 7 and 8, where the third composition 44 has a mechanical property with the insulating material mechanical property desired range. The second composition 40 can be restructured such that the third composition 44 has different mechanical properties, such as higher hardness and elastic modulus, as well as other more desirable mechanical properties such as residual stress, thermal stability, adhesion to a variety of substrates, compressive strength, fracture toughness, resilience, shear strength, etc. The second composition 40 may include methyl groups or other organic compounds covalently bonded to silicon atoms, and may include some hydroxyl groups covalently bonded to silicon atoms. The silicon/carbon bonds where the methyl groups or other organic compounds are bonded to silicon atoms can be broken and replaced with silicon/oxygen bonds, and the additional silicon/oxygen bonds increase or otherwise change several mechanical properties, including hardness and elastic modulus. The oxidation of the second composition 40 can be carried out to varying degrees, so the mechanical properties can be "tuned" or adjusted to a desired amount, such as to within the insulating layer mechanical property desired range. In some embodiments, the dielectric constant may increase as the silicon/carbon bonds are replaced with silicon/oxygen bonds.

The second composition 40 can be altered to form the third composition 44 using one or more oxidative reagents such as silicon tetrafluoride, hydrogen fluoride, and a wide variety of other compounds. In some embodiments, the oxidative reagent includes silicon atoms, and some of the silicon atoms in the oxidative reagent may remain in the third composition 44. The oxidative reagent may also be diluted with non-reactive gases, such as helium or nitrogen, that may help control the introduction and concentration of the oxidative reagent. In many embodiments, the oxidative reagent is exposed to the insulating layer 30 in the gaseous phase at an exposure temperature from about 20 degrees centigrade (° C.) to about 400° C., and the exposure time can vary from about 1 second to about 30 minutes or more. Water could be used as the oxidative reagent in some embodiments, and water may be combined with one or more other oxidative reagents in alternate embodiments to aid the restructuring process for the other oxidative reagent(s) by providing oxygen and a solvent. The oxidative reagent may be relatively small compound, so it can pass into the pores 42 of the insulating layer 30. The pores 42 have a pore surface 46, and the restructuring process may begin on the pore surface 46, and in some embodiments the restructuring process may be primarily limited to the pore surface 46. For example, about 50% or more of the silicon/carbon bonds replaced with silicon/oxygen bonds may be on the pore surface 46, and about 90% or more of the pore surface 46 of the third composition 44 may be silicon oxide, which is formed with silicon/oxygen bonds. The restructuring process may be facilitated with electromagnetic radiation, such as ultraviolet light or visible light, or electron beam radiation, or a combination thereof.

The adjustment of the second composition 40 to the third composition 44 can be controlled by determining several process conditions such that one or more desired mechanical properties of the third composition 44 are within the insulating layer mechanical property desired range or ranges, including: an exposure temperature; an exposure pressure; an exposure time; the oxidative reagent used; the oxidative reagent concentration; diluents that may be used; the exposure time, frequency, and intensity of the optional electromagnetic radiation and/or electron beam radiation; and other process conditions. In an exemplary embodiment, the Vickers hardness of the third composition 44 may be increased to about 2 GPa or more, an elastic modulus of about 10 GPa or more, and a dielectric constant of about 2.5 or less. For example, the adjustment process may produce a third composition 44 meeting insulating layer mechanical property desired ranges of a Vickers hardness of about 2 GPa or more, an elastic modulus of about 12 GPa or more, and a dielectric constant of about 2.6 or less.

The oxidative reagent may not attack other structures of the integrated circuit 8, such as the contact 38, and the bloc layer 22 may prevent the oxidative reagent from penetrating to the plug layer 14 or other components underlying the plug layer 14. As such, a common first composition 32 and second composition 40 can be used to form the insulating layer 30, and the formation of the third composition 44 may produce an insulating layer 30 with mechanical properties that fall within desired ranges.

The process described above can be adjusted for several different embodiments. For example, the plug layer 14 could be formed from a porous OSG, and the plug layer dielectric constant and a plug layer mechanical property can be adjusted to fall within a plug layer mechanical property desired range as described above for the insulating layer 30. The plug layer mechanical properties could be adjusted before the blok layer 22 was formed. As such, the electrically insulating material of the plug layer 14 may be the same or different than the material of the insulating layer 30 in different embodiments. The insulating layer 30 described above may be an interlayer dielectric, but in alternate embodiments the insulating layer 30 may be other insulating components of an integrated circuit 8. As such, the insulating layer 30 could part of the electronic component 12, or a shallow trench isolation, or other insulating layers used in the manufacture of integrated circuits 8, as understood by those skilled in the art.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
    forming an insulating layer overlying a substrate, wherein the insulating layer comprises a first composition, wherein the first composition comprises silicon oxide and a porogen;
    forming a via in the insulating layer;
    removing the porogen from the first composition to form a second composition comprising a pore, wherein the second composition has a dielectric constant lower than that of the first composition;
    determining an insulating layer mechanical property desired range, wherein the second composition has a mechanical property outside of the insulating layer mechanical property desired range;
    altering the second composition to form a third composition, wherein the third composition has the mechanical property within the insulating layer mechanical property desired range; and
    forming a contact within the via, wherein the contact is formed before altering the second composition to form the third composition.

2. The method of claim 1 further comprising:
    forming an electrical component overlying the substrate;
    forming a plug layer overlying the electrical component and the substrate, wherein the plug layer comprises an electrically insulating material;
    forming a cover through the plug layer, wherein the cover comprises an electrically conductive material in electrical contact with the electrical component;
    forming a blok layer overlying the plug layer; and wherein
    forming the insulating layer overlying the substrate comprises forming the insulating layer overlying the blok layer; and
    forming the contact within the via comprises forming the contact in electrical contact with the cover.

3. The method of claim 2 further comprising:
    altering the plug layer to adjust a plug layer mechanical property to within a plug layer mechanical property desired range, wherein the plug layer is altered prior to forming the blok layer.

4. The method of claim 1 wherein altering the second composition comprises restructuring a pore surface of the second composition to form silicon/oxygen bonds.

5. The method of claim 1 wherein altering the second composition comprises exposing the second composition to an oxidative reagent.

6. The method of claim 5 wherein altering the second composition comprises exposing the second composition to water with the oxidative reagent.

7. The method of claim 5 wherein altering the second composition comprises exposing the second composition to ultraviolet light, an electron beam, or a combination thereof.

8. The method of claim 5 wherein exposing the second composition to the oxidative reagent comprises exposing the second composition to the oxidative reagent to break silicon/carbon bonds on a pore surface.

9. The method of claim 5 wherein exposing the second composition to the oxidative reagent further comprises exposing the second composition to the oxidative reagent for an exposure time and at an exposure temperature, wherein the exposure time and the exposure temperature are determined to adjust the mechanical property to within the insulating layer mechanical property desired range.

10. The method of claim 1 wherein altering the second composition to form the third composition comprises adjusting a hardness of the third composition to within the insulating layer mechanical property desired range for hardness.

11. The method of claim 10 wherein altering the second composition to form the third composition comprises producing the third composition having a Vickers hardness of about 2 gigapascals or more.

12. The method of claim 11 wherein removing the porogen from the insulating layer to form the pore in the second composition comprises forming the second composition having a Vickers hardness of about 1.3 gigapascals or less.

13. The method of claim 1 wherein altering the second composition to form the third composition comprises altering the second composition to form the third composition, wherein the dielectric constant of the third composition is about 2.5 or less.

14. A method of producing an integrated circuit comprising:

forming an insulating layer overlying a substrate, wherein the insulating layer comprises a first composition, and wherein the first composition comprises silicon oxide and a porogen;

forming a via in the insulating layer;

removing the porogen from the first composition to form a second composition comprising a pore, wherein the pore comprises a pore surface;

restructuring the second composition to form a third composition, wherein restructuring the second composition comprises breaking a silicon/carbon bond on the pore surface and forming a silicon/oxygen bond on the pore surface such that a hardness of the third composition is harder than the hardness of the second composition; and forming a contact within the via, wherein the contact is formed before restructuring the second composition.

15. The method of claim 14 further comprising:

forming an electrical component overlying the substrate;

forming a plug layer overlying the electrical component and the substrate, wherein the plug layer comprises an electrically insulating material;

forming a cover in the plug layer, wherein the cover comprises an electrically conductive material in electrical contact with the electrical component;

forming a blok layer overlying the plug layer; and wherein forming the insulating layer overlying the substrate comprises forming the insulating layer overlying the blok layer; and forming the contact within the via comprises forming the contact in electrical contact with the cover.

16. The method of claim 14 wherein restructuring the second composition comprises restructuring the second composition to form the third composition, wherein the third composition has a mechanical property within an insulating layer mechanical property desired range.

17. The method of claim 14 wherein restructuring the second composition comprises increasing the Vickers hardness of the second composition from about 1.3 gigapascals or less to the Vickers hardness of the third composition of about 2 gigapascals or more.

* * * * *